(12) United States Patent
Takeya et al.

(10) Patent No.: US 7,250,960 B2
(45) Date of Patent: Jul. 31, 2007

(54) THERMAL HEAD HAVING ADHESIVE INTERPOSED BETWEEN ADHESION SURFACE OF HEAT-DISSIPATION PLATE AND ADHESION SURFACE OF HEAD SUBSTRATE AND METHOD FOR PRODUCING THE SAME

(75) Inventors: Tsutomu Takeya, Niigata-ken (JP); Kazuhiko Nakazawa, Niigata-ken (JP); Shigeto Yamada, Niigata-ken (JP); Masaru Sakurai, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 178 days.

(21) Appl. No.: 11/092,181

(22) Filed: Mar. 29, 2005

(65) Prior Publication Data

US 2005/0219349 A1     Oct. 6, 2005

(30) Foreign Application Priority Data

Mar. 30, 2004 (JP) ............................. 2004-100225

(51) Int. Cl.
*B41J 2/335* (2006.01)
(52) U.S. Cl. ...................................... 347/200; 347/205
(58) Field of Classification Search ................ 347/200, 347/201, 205, 207
See application file for complete search history.

(56) References Cited

U.S. PATENT DOCUMENTS 5,285,216 A     2/1994  Ota et al.
5,444,475 A *  8/1995  Mitani ........................ 347/200
5,568,176 A    10/1996  Moon et al.

FOREIGN PATENT DOCUMENTS

| JP | 60107361 | 6/1985 |
| JP | 1-190467 | 7/1989 |
| JP | 11-28829 | 2/1999 |
| JP | 1-131538 | 9/1999 |
| JP | 2001-315371 | * 11/2001 |
| JP | 2004/322450 | * 11/2004 |

OTHER PUBLICATIONS

Search Report dated Oct. 26, 2006 for corresponding European Patent Application No. 05006022.7.

* cited by examiner

*Primary Examiner*—Huan Tran
(74) *Attorney, Agent, or Firm*—Brinks Hofer Gilson & Lione

(57) ABSTRACT

A thermal head includes a head substrate having a plurality of heating resistors which generate heat by electrical dissipation, a common electrode connected to one end of each heating resistor, and a plurality of individual electrodes connected to the other ends of the respective heating resistors. The head substrate is disposed on a heat-dissipation plate. A wide-gap stepped portion is disposed in correspondence with at least a location of the head substrate directly below the heating resistors, and increases an interval between an adhesion surface of the head substrate and an adhesion surface of the heat-dissipation plate. A resilient adhesive capable of absorbing thermal strain is interposed between the adhesion surface of the heat-dissipation plate and the adhesion surface of the head substrate in an adhesion plane where the wide-gap stepped portion is disposed.

20 Claims, 7 Drawing Sheets

THERMAL HEAD HAVING ADHESIVE INTERPOSED BETWEEN ADHESION SURFACE OF HEAT-DISSIPATION PLATE AND ADHESION SURFACE OF HEAD SUBSTRATE AND METHOD FOR PRODUCING THE SAME

This application claims the benefit of priority to Japanese Patent Application No. 2004-100225, filed on Mar. 30, 2004, which is incorporated herein by reference.

TECHNICAL FIELD

The present application relates to a thermal head mounted in, for example, a thermal transfer printer, and a method for producing the same.

BACKGROUND

A thermal head comprises a plurality of resistors heated by electrical dissipation, and performs a printing operation by applying heat energy generated by the heating resistors to a print medium. Conventionally, a head substrate and a printed circuit board are separately provided, and an aluminum heat-dissipation plate is adhered to the lower surface of the head substrate and the lower surface of the printed circuit board. The head substrate has the plurality of heating resistors, a common electrode connected in common to one end of the plurality of heating resistors, and a plurality of individual electrodes connected to the other end of the respective heating resistors. The printed circuit board has a plurality of drive elements which control the heating of the heating resistors via the individual electrodes at the head substrate. In order to achieve high-speed printing, it is necessary to increase the thermal response of the heating resistors by discharging excess heat via the aluminum heat-dissipation plate. Structures of thermal heads comprising heat-dissipation plates are disclosed in, for example, Japanese Unexamined Patent Application Publication Nos. 1-190467 and 11-28829 and Japanese Unexamined Utility Model Registration Application Publication No. 1-131538 (microfilm).

In recent years, a reduction in the size of a thermal head has caused a reduction in the size of a head substrate. However, when the size of the head substrate is reduced, the heating effect of heating resistors does not change, whereas the contact area of the head substrate and a heat-dissipation plate is reduced. Therefore, the quantity of heat transmitted to the heat-dissipation plate from the head substrate via an adhesive layer when printing is carried out is relatively increased. This excess heat expands the length of the heat-dissipation plate, as a result of which the adhesive layer may become peeled depending upon the conditions. The amount of increase in the length is particularly large at the ends of the heat-dissipation plate. As shown in FIG. 7, this results in a reduction in shear strength of the adhesive, and the adhesive layer tends to become peeled. In FIG. 7, the measuring points are distributed over the length of the head substrate. The tendency to peel becomes more noticeable as the heating temperature increases. Air tends to enter peeled areas of the adhesive layer, and such areas act as heat accumulators, causing the temperature of the heating resistors to increase. Therefore, the print density of the heating resistors disposed at the ends increases, thereby resulting in inconsistencies in the print density as a whole.

In addition, when the size of the head substrate is reduced, the head substrate becomes less resistant to bending. For example, when an attempt is made to adhere a printed circuit board and the head substrate to the heat-dissipation plate after wire bonding and sealing individual electrodes and drive elements, a large warping occurs in a plane direction of the head substrate by thermal contraction of a sealing resin, thereby deteriorating print quality such as by causing print fading. Conventionally, the area of the head substrate is at least 6 $mm^2$. Therefore, even if the sealing resin undergoes thermal contraction, the head substrate does not tend to bend. Consequently, even if warping occurs in a plane of the head substrate, the warping is restricted within a range not affecting the print quality.

Warping in a plane direction of the head substrate may be restricted by previously adhering the head substrate and the printed circuit board to the heat-dissipation plate, and, while an adhesive prevents the head substrate from bending, by wire-bonding and sealing the individual electrodes and drive elements. Conventionally, the individual electrodes, formed of aluminum (Al) to reduce costs, and the drive elements are connected with a gold (Au) joining wire. The Al—Au wire bonding is carried out in an atmosphere of approximately 150° C. in order to form an Al—Au alloy layer by breaking surface oxidation layers of the individual electrodes by ultrasonic vibration. Therefore, the adhesive layer may become peeled as a result of the expansion of the heat-dissipation plate in this high-temperature atmosphere. As described above, the peeled areas of the adhesive layer act as heat-accumulation layers due to air entering the peeled areas. Therefore, there are inconsistencies in the print density.

SUMMARY

A thermal head which can be reduced in size, which may reduce warping caused by thermal strain, and which may prevent print density inconsistencies caused by peeling of an adhesive layer from occurring is described, as well as a method for producing the same.

Warping of a printed circuit board and a head substrate may be mitigated by adhering the head substrate and the printed circuit board to a heat-dissipation plate and then by carrying out a wire boding step and a sealing step, absorbing thermal strain of the heat-dissipation plate by interposing a resilient adhesive having a sufficient thickness between the head substrate and the heat-dissipation plate, and properly maintaining the heat-dissipation property of the heat-dissipation plate by applying the resilient adhesive to localized portions.

In an aspect, a thermal head comprises a head substrate having a plurality of heating resistors which generate heat by electrical dissipation, a common electrode connected to one end of each heating resistor, and a plurality of individual electrodes connected to the other ends of the respective heating resistors, the head substrate being adhered and secured to a heat-dissipation plate. In the thermal head, a wide-gap stepped or recessed portion is disposed in correspondence with at least a location of the head substrate directly below the heating resistors, the wide-gap stepped portion increasing an interval between an adhesion surface of the head substrate and an adhesion surface of the heat-dissipation plate. A resilient adhesive capable of absorbing thermal strain is interposed between the adhesion surface of the heat-dissipation plate and the adhesion surface of the head substrate in an adhesion plane where the wide-gap stepped portion is disposed.

In one form, the heating resistors are disposed in a row at one end of the head substrate, and a plurality of the wide-gap stepped portions are disposed in correspondence with each end of the head substrate in a direction perpendicular to a direction of disposition of the heating resistors. When wide-gap stepped portions are disposed in correspondence with both ends of the head substrate, it is possible to achieve contraction balance when the resilient adhesive in the wide-gap stepped portions hardens, so that the head substrate can be adhered to the heat-dissipation plate horizontally in a balanced manner.

In another form, areas of portions where the head substrate is placed on the resilient adhesive in the wide-gap stepped portions are substantially the same.

In still another form, the wide-gap stepped portions are disposed directly below the heating resistors and directly below the individual electrodes. Since the temperature directly below the plurality of heating resistors is increased by heat generated by the heating resistors when the head operates, the thermal strain of the heat-dissipation plate caused by the heat is absorbed by the resilient adhesive at the wide-gap stepped portion. In addition, since the temperature directly below the plurality of individual electrodes is high when wire bonding of the individual electrodes and drive elements is carried out, the thermal strain of the heat-dissipation plate caused by the heat may be absorbed by the resilient adhesive at the wide-gap stepped portion.

The thickness of the resilient adhesive at the wide-gap stepped portion may be at least approximately 50 µm. When the resilient adhesive has a thickness in this range, it has a resiliency which allows it to absorb thermal strain. Therefore, thermal strain of the heat-dissipation plate is accommodated when the heating resistors are generating heat and when external heat is applied.

In still another form, the adhesion surface of either one of the head substrate and the heat-dissipation plate is a flat surface, and the adhesion surface of either of the other of the head substrate and the heat-dissipation plate is a non-planar surface having the wide-gap stepped portion. The heat-dissipation plate may be an aluminum heat-dissipation plate.

According to another aspect, a method for producing a thermal head is described, comprising the steps of providing a head substrate, a printed circuit board, and a heat-dissipation plate to which the head substrate and the printed circuit board are to be adhered and secured, the head substrate having a plurality of heating resistors which generate heat by electrical dissipation, a common electrode connected to one end of each heating resistor, and a plurality of individual electrodes connected to the other ends of the respective heating resistors, the printed circuit board having a plurality of drive elements which control the electrical dissipation in the heating resistors at the head substrate, forming a wide-gap stepped portion at a portion in an adhesion plane where the head substrate and the heat-dissipation plate are to be adhered, the wide-gap stepped portion increasing an interval between an adhesion surface of the head substrate and an adhesion surface of the heat-dissipation plate, applying a resilient adhesive capable of absorbing thermal strain in the adhesion plane where the heat-dissipation plate and the head substrate are to be adhered and where the wide-gap stepped portion is disposed so that the wide-gap stepped portion is filled with the resilient adhesive, adhering the head substrate and the heat-dissipation plate to each other by hardening the resilient adhesive while at least a location of the head substrate directly below the heating resistors is situated on the wide-gap stepped portion, wire bonding the individual electrodes at the head substrate and the drive elements at the printed circuit board, and sealing the bonded individual electrodes at the head substrate and the bonded drive elements at the printed circuit board.

The heating resistors are disposed in one row at one end of the head substrate, and a pair of the stepped portions are disposed opposing each other and perpendicular to a direction of disposition of the heating resistors. In this case, the head substrate is adhered to the heat-dissipation plate by placing both ends of the heat substrate, as viewed perpendicularly to the direction of disposition of the heating resistors, on the wide-gap stepped portions. Desirably, the head substrate is adhered to the heat-dissipation plate while a location directly below the heating resistors and a location directly below the individual electrodes are situated on the wide-gap stepped portions.

The individual electrodes at the head substrate may be formed of aluminum, and the wire bonding step performed on the individual electrodes and the drive elements at the printed circuit board with a gold joining wire.

DETAILED DESCRIPTION

Exemplary embodiments may be better understood with reference to the drawings, but these examples are not intended to be of a limiting nature. Like numbered elements in the same or different drawings perform equivalent functions.

Figure 1:
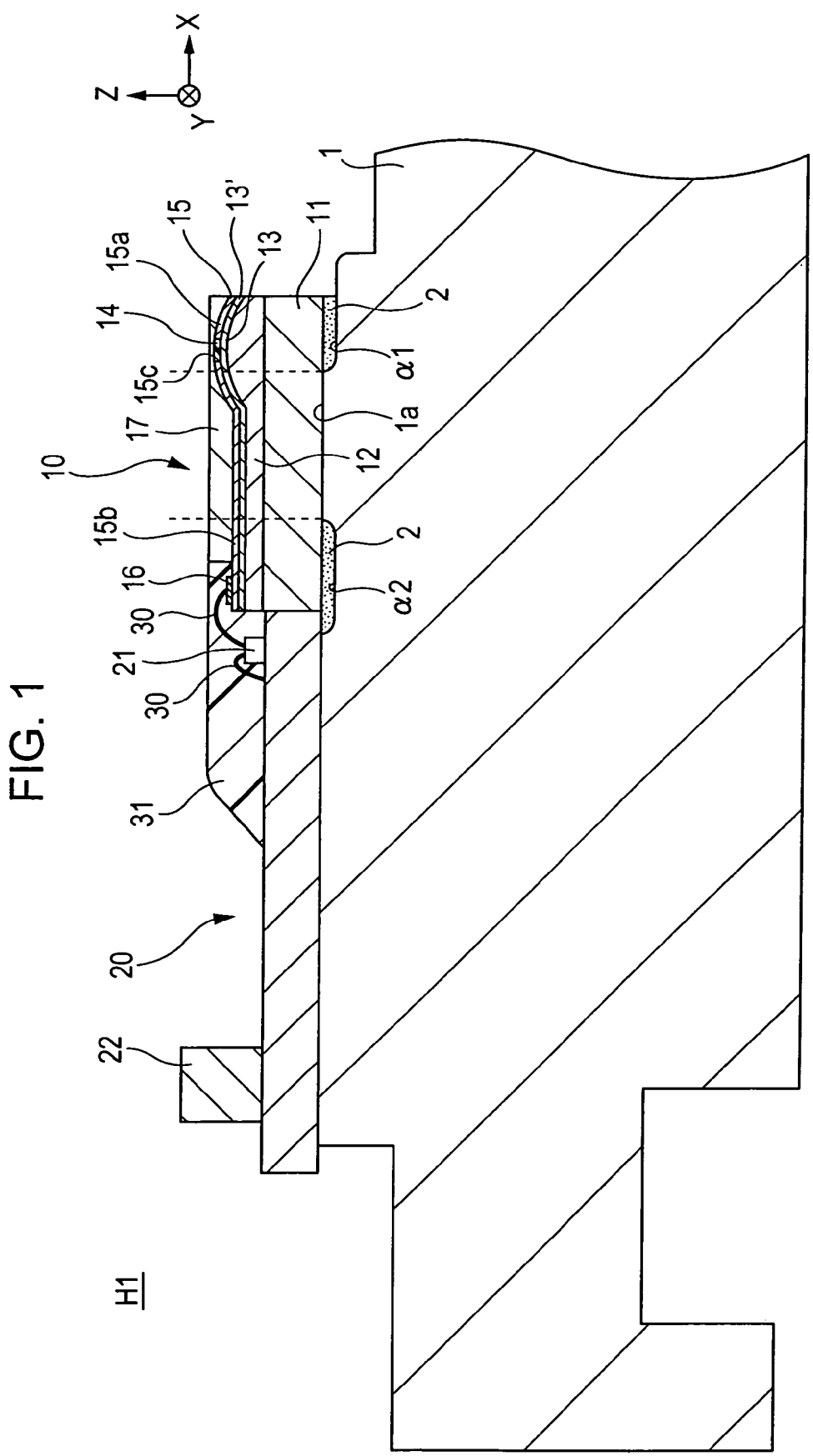
FIG. 1 is a sectional view of the structure of a thermal head.

FIG. 1 is a sectional view of the structure of a thermal head. A thermal head H1 comprises a head substrate 10 and a printed circuit board 20, both of which are adhered to an aluminum heat-dissipation plate 1.

Figure 2:
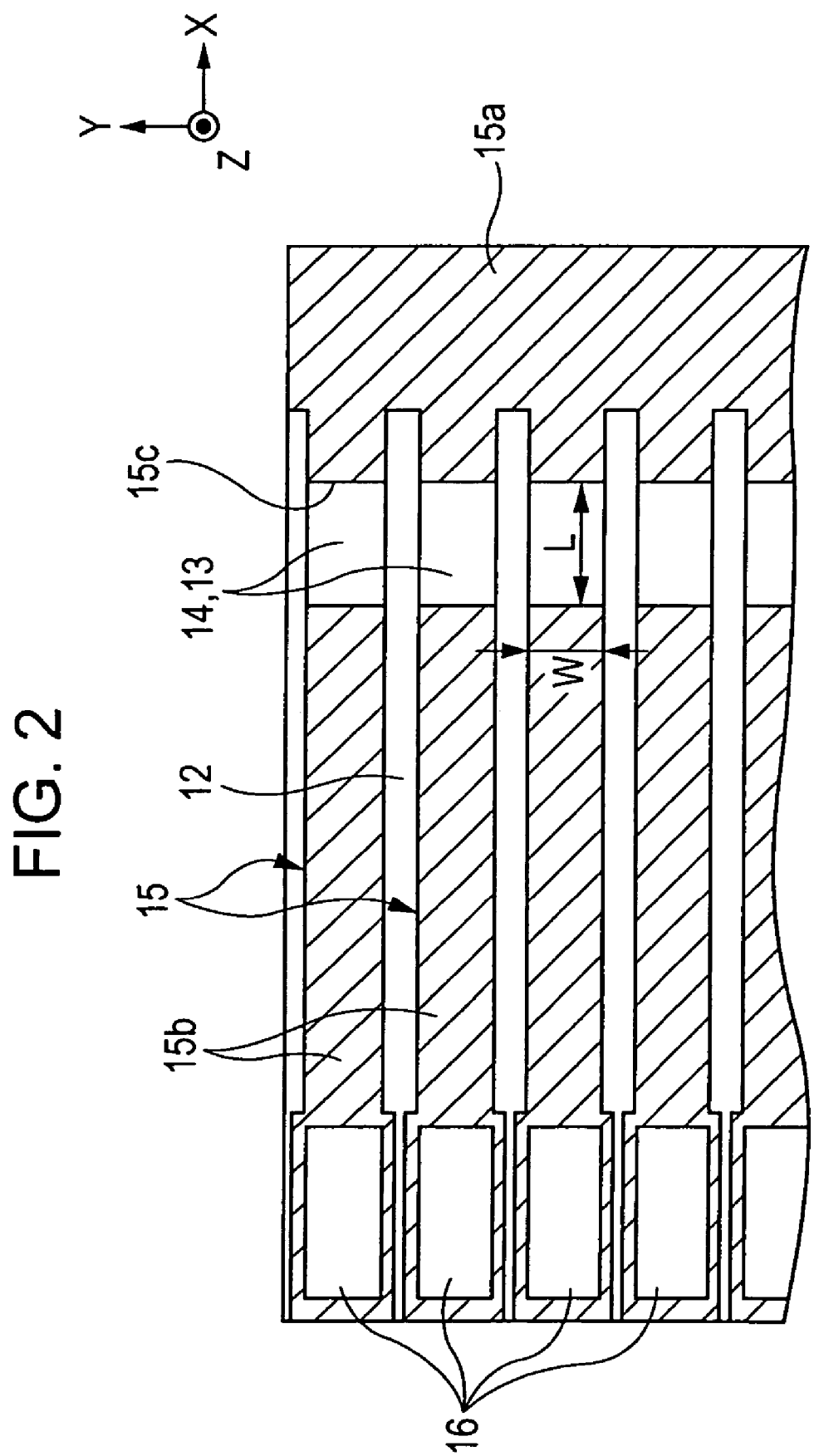
FIG. 2 is a plan view of a head substrate shown in FIG. 1 (wear resistance protective layer is not shown)

As shown in FIGS. 1 and 2, in the head substrate 10, a glazed layer 12, a plurality of heating resistors 13, an insulating barrier layer 14, an electrode layer 15, and a wear resistance protective layer 17 are disposed on a baseplate 11 formed of an alumina or a ceramic material. The glazed layer 12 has a protruding portion at one end of the baseplate and a flat portion having a uniform thickness and extending to the other end of the baseplate from the protruding portion. The heating resistors 13 are disposed on the protruding portion of the glazed layer 12. The insulating barrier layer 14 covers the surface of each heating resistor 13 and sets the sizes (resistance lengths L and resistance widths W) of the heating resistors 13 in a plane. The electrode layer 15 supplies power to the heating resistors 13. The wear resistance protective layer 17 protects the insulating barrier layer 14 and the electrode layer 15 from contact with, for example, a platen. The heating resistors 13 are part of a resistance layer 131 formed on the glazed layer 12, and are separated from each other by a predetermined interval in an illustrated direction Y. After depositing the electrode layer 15 on the entire resistance layer 13' and insulating barrier 14, an opening 15c is formed to expose the surface of the insulating barrier layer 14. In the electrode layer 15, a common electrode 15a and a plurality of individual electrodes 15b are separated by the opening 15c. The common electrode 15a is connected to one ends of all of the heating resistors 13 in the lengthwise direction thereof, and the individual electrodes 15b are connected to the other ends of the respective heating resistors 13 in the lengthwise direction thereof. Electrode pads 16 for wire bonding are disposed on the respective individual electrodes 15b. The electrode layer 15 and the electrode pads 16 in the embodiment are formed of aluminum (Al).

The printed circuit board 20 is provided separately from the head substrate 10, and has a plurality of drive elements 21, an external connection connector 22, etc. The drive elements 21 control the electrical dissipation in the heating resistors 13. The connector 22 connects an external device and a circuit system including the drive elements 21. The drive elements 21 are provided for the respective heating resistors 13, and are disposed at one end of the printed circuit board 20. The electrode pads 16 at the individual electrodes 15b and the respective drive elements 21 are bonded to each other with a gold (Au) joining wire 30. Bonding portions of the individual electrodes 15b, the electrode pads 16, the drive elements 21, and the Au joining wire 30 are sealed with a sealing resin 31 such as epoxy resin. Each drive element 21 is also connected to the circuit system at the printed circuit board 20 with the Au joining wire 30.

Figure 3:
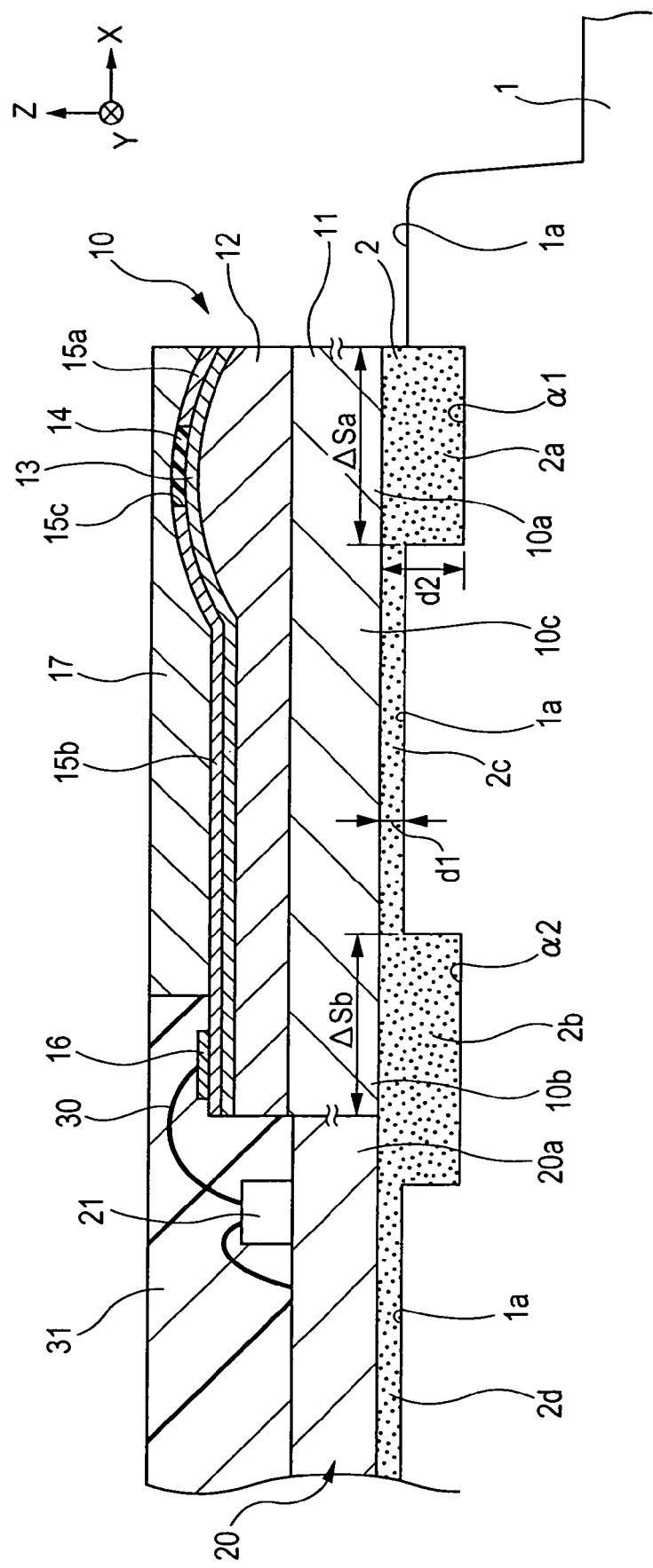
FIG. 3 is a partial enlarged view of FIG. 1.

As shown in the enlarged view of FIG. 3, first and second wide-gap stepped portions or recesses α1 and α2, which increase an interval d between an adhesion surface of the head substrate 10 and an adhesion surface of the aluminum heat-dissipation plate 1 (d1<d2), are formed in correspondence with both ends of the head substrate 10 in a direction X thereof (that is, in a direction perpendicular to the direction of disposition of the heating resistors 13), in an adhesion plane of the head substrate 10 and the aluminum heat-dissipation plate 1. The wide-gap stepped portions α1 and α2 are spaced apart by a predetermined interval in a horizontal direction in the figure and are substantially parallel to each other. The first wide-gap stepped portion α1 is positioned directly below the heating resistors 13, and the second wide-gap stepped portion α2 is positioned under an end portion where the head substrate 10 and the printed circuit board 20 are connected. The second wide-gap stepped portion α2 is larger than the first wide-gap stepped portion α1 in the direction X in the figure. In the embodiment, the lower surface of the head substrate 10 and the lower surface of the printed circuit board 20 are flat surfaces, whereas an upper surface 1a of the aluminum heat-dissipation plate 1 may be a non-planar surface including the wide-gap stepped portions α1 and α2.

A resilient adhesive 2 capable of absorbing thermal strain is interposed between the adhesion surface of the aluminum heat-dissipation plate 1 and the adhesion surface of the head substrate 10 in the adhesion plane where the wide-gap stepped portions α1 and α2 are formed. The resilient adhesive 2 has an non-uniform thickness, and has first and second thick portions 2a and 2b with which the wide-gap stepped portions α1 and α2 are filled and first and second thin portions 2c and 2d. The thick portions 2a and 2b have thicknesses of at least approximately 50 μm, whereas the thin portions 2c and 2d have thicknesses of approximately 20 μm. The first thick portion 2a is used to adhere the head substrate 10 and the aluminum heat-dissipation plate 1 to each other at a location directly below the heating resistors 13 and absorbs the thermal strain of the aluminum heat-dissipation plate 1 caused by heat from the heating resistors 13 by its resiliency. The second thick portion 2b is used to adhere the head substrate 10 and the printed circuit board 20 to the aluminum heat-dissipation plate 1 at a location directly below the electrode pads 16. The illustrated horizontal size of the second thick portion 2b is larger than that of the thick portion 2a, but an area ΔSa of a portion where the head substrate 10 is placed on the first thick portion 2a and an area ΔSb of a portion where the head substrate 10 is placed on the second thick portion 2b are substantially the same (that is, ΔSa=ΔSb). The adhesion balance of the head substrate 10 is maintained by the first thick portion 2a and the second thick portion 2b. The first thin portion 2c is disposed between the first thick portion 2a and the second thick portion 2b, and is used to adhere a central portion 10c of the head substrate 10 and the aluminum heat-dissipation plate 1 to each other. The second thick portion 2b is disposed between the second thin portion 2d and the first thin portion 2c. The second thin portion 2d is used to adhere the aluminum heat-dissipation plate 1 and a portion of the printed circuit board 20 other than an end portion 20a to each other. Excess heat generated by the heating resistors 13 and externally applied excess heat are rapidly transmitted from the head substrate 10 and the printed circuit board 20 to the aluminum heat-dissipation plate 1 via the thin portions 2c and 2d, and are emitted outward from the aluminum heat-dissipation plate 1. The thicknesses of the thin portions 2c and 2d are substantially equal to an interval d1 between the adhesion surface of the aluminum heat-dissipation plate 1 and the adhesion surfaces of the head substrate 10 and the printed circuit board 20.

Figure 4:
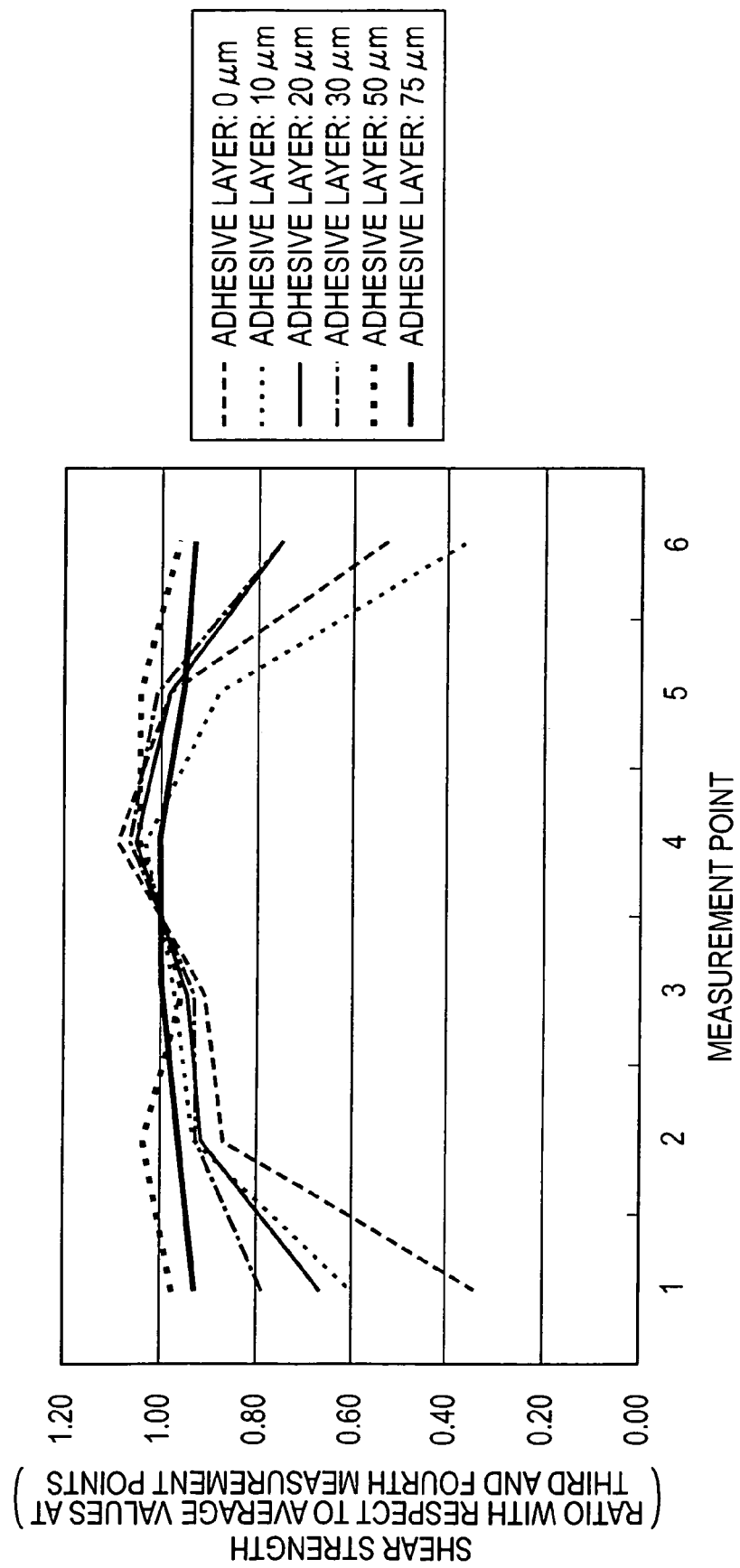
FIG. 4 is a graph of the measurements of shear strengths of a plurality of resilient adhesives at different measurement points after heating the resilient adhesives, as a function of the thicknesses of thick portions of the resilient adhesives (the thicknesses of thin portions of the resilient adhesives being constant)

FIG. 4 is a graph of the measurements of shear strengths at different measurement points after heating resilient adhesives 2, as a function of the thicknesses of thick portions 2a and 2b, where the thicknesses of thin portions 2c and 2d of the resilient adhesives is constant). The heating temperature is approximately 170° C. A first measurement point to a sixth measurement point are disposed in a row in the direction X shown in FIG. 3, with the first measurement point corresponding to an end 10b of the head substrate 10 and the sixth measurement point corresponding to an end 10a of the head substrate 10. In the graph shown in FIG. 4, the shear strength at each measurement point is a ratio with respect to the average shear strengths at the third measurement point and the fourth measurement point. As can be seen from FIG. 4, the larger the thicknesses of the thick portions 2a and 2b of the resilient adhesives 2, the smaller the difference between the shear strengths at the ends 10a and 10b and the shear strength at the central portion 10c of the head substrate 10, so that a substantially uniform overall shear strength can be provided. In other words, when the thick portions 2a and 2b of the adhesives 2 have larger thicknesses, the aluminum heat-dissipation plate 1 can accommodate a wider range of thermal strain.

Figure 5:
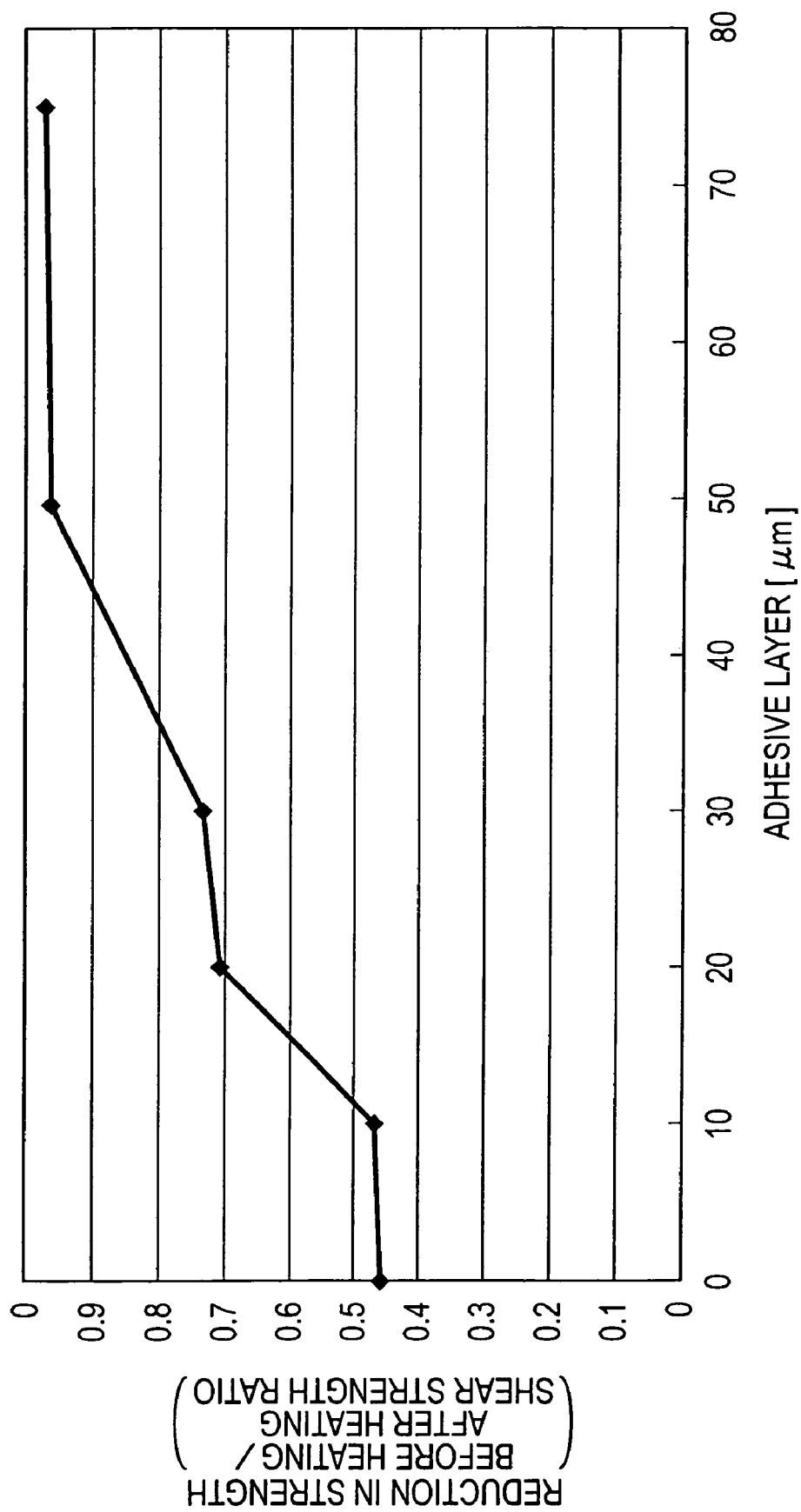
FIG. 5 is a graph of the measurements of ratios between the shear strengths of the resilient adhesives at a first measurement point or a sixth measurement point before and after heating the resilient adhesives, as a function of the thicknesses of the thick portions of the resilient adhesives (the thicknesses of the thin portions of the resilient adhesives being constant)

FIG. 5 is a graph of the measurements of ratios between shear strengths before and after heating the resilient adhesives 2 at the first measurement point or the sixth measurement point, as a function of the thicknesses of the thick portions 2a and 2b where the thicknesses of thin portions 2c and 2d of the resilient adhesives is constant. The heating temperature is, for example, approximately 170° C. As can be seen from FIG. 5, when the thicknesses of the thick portions 2a and 2b are within a range of about 10 µm or less, the ratios between the shear strengths before and after heating are equal to or less than 0.5. Therefore, the adhesive strengths of the thick portions 2a and 2b are approximately halved or more than halved by the heating. In addition, as can be seen from FIG. 5, as the thicknesses of the thick portions 2a and 2b increase, the ratios between the shear strengths before and after the heating increase. Therefore, when the thicknesses of the thick portions 2a and 2b are in a range exceeding approximately 50 µm, the ratios between the shear strengths before and after heating are substantially constant at approximately 0.95 or greater. In other words, if the thicknesses of the thick portions 2a and 2b are greater than approximately 50 µm, a reduction in the adhesive strength resulting from heating can be mitigated.

To mitigate the reduction in the shear strength (adhesive strength) of the resilient adhesive 2 at the first and sixth measurement points corresponding to both ends of the head substrate 10, the thicknesses of the thick portions 2a and 2b are at least approximately 50 µm on the basis of the measurement results shown in FIGS. 4 and 5. The thicknesses of the thick portions 2a and 2b are substantially equal to an interval d2 between the adhesion surface of the head substrate 10 and the adhesion surfaces defining the wide-gap stepped portions α1 and α2. Therefore, it may be desirable to set the adhesion surface interval d2 to a value which can withstand the thermal strain of the aluminum heat-dissipation plate 1. The difference between the thicknesses of the thick portions 2a and 2b and those of the thin portions 2c and 2d of the resilient adhesive 2 corresponds to the difference between the height of the upper surface 1a of the aluminum heat-dissipation plate 1 and the surfaces defining the wide-gap stepped portions α1 and α2.

Next, a method for producing the thermal head H1 will be described.

First, the head substrate 10 and the printed circuit board 20 shown in FIG. 1 are provided. Next, the aluminum heat-dissipation plate 1 is provided. The wide-gap stepped portions α1 and α2, which increase the interval d between the adhesion surface of the head substrate 10 and that of the aluminum heat-dissipation plate 1, are formed at specific locations of the upper surface 1a of the aluminum heat-dissipation plate 1. The first wide-gap stepped portion α1 and the second wide-gap stepped portion α2 are spaced apart by a predetermined interval in a direction perpendicular to the direction of disposition of the heating resistors 13 at the head substrate 10 to be adhered and secured and are substantially parallel to each other. The illustrated X-direction size of the second wide-gap stepped portion α2 is larger than that of the first wide-gap stepped portion α1.

The resilient adhesive 2 capable of absorbing thermal strain is applied to the upper surface 1a of the aluminum heat-dissipation plate 1 having the wide-gap stepped portion α1 and the wide-gap stepped portion α2. Here, the resilient adhesive 2 is applied so as to be embedded in the entire wide-gap stepped portion α1 and the wide-gap stepped portion α2, so that the surface of the resilient adhesive 2 in the wide-gap stepped portion α1 and the wide-gap stepped portion α2 and the surface of the resilient adhesive 2 on the upper surface 1a of the aluminum heat-dissipation plate 1 are at the same height, thereby forming a flat surface. As a result, the thick portions 2a and 2b of the resilient adhesive 2 are formed in the wide-gap stepped portion α1 and the wide-gap stepped portion α2, and the thin portions 2c and 2d of the resilient adhesive 2 are formed on the upper surface 1a of the aluminum heat-dissipation plate 1. The thick portions 2a and 2b of the resilient adhesive 2 may have thicknesses on the order of 75 µm, while the thin portions 2c and 2d may have thicknesses on the order of 20 µm.

Next, the head substrate 10 and the printed circuit board 20 are placed on the aluminum heat-dissipation plate 1 to which the resilient adhesive 2 has been applied. The head substrate 10 is disposed so that the end 10a directly below the heating resistors 13 is disposed on the first thick portion 2a, the end 10b directly below the electrode pads 16 is disposed on the second thick portion 2b, and the central portion 10c between the end 10a and the end 10b is disposed on the first thin portion 2c. The printed circuit board 20 is disposed so that the end portion 20a where the drive elements 21 are disposed contacts the end 10b of the head substrate 10 and is disposed on the second thick portion 2b and so that an area other than the end portion 20a is disposed on the second thin portion 2d. In this state, the resilient adhesive 2 is hardened by, for example, heating in order to adhere the aluminum heat-dissipation plate 1 and the head substrate 10 and the printed circuit board 20. In an example, the adhesion area ΔSa of the head substrate 10 and the first thick portion 2a and the adhesion area ΔSb of the head substrate 10 and the second thick portion 2b are symmetrically disposed with respect to the adhesion area of the head substrate 10 and the first thin portion 2c. Therefore, when the resilient adhesive 2 is hardened, contraction balance may be achieved, so that the head substrate 10 is horizontally adhered to the surface of the aluminum heat-dissipation plate 1.

After adhering the aluminum heat-dissipation plate 1 and the head substrate 10 and the printed circuit board 20 to each other, the individual electrodes 15b at the head substrate 10 and the drive elements 21 at the printed circuit board 20 are electrically connected. More specifically, a surface oxidation layer is broken by applying ultrasonic vibration to the surface of the electrode pad 16 on its corresponding electrode 15b in order to form an Al—Au alloy layer on the electrode pads 16, connecting the electrode pads 16 and the Au joining wire 30. Similarly, an electrode pad (not shown) disposed on its corresponding drive element 21 and the Au joining wire 30 are connected. In this wire bonding step, in order to join Au and Al, the electrode pads 16 on the respective electrodes 15b and the electrode pads on the drive elements 21 may be maintained at a temperature of approximately 150° C. or higher. In order to achieve this temperature, the aluminum heat-dissipation plate 1 may be heated from its back side. Here, although the aluminum heat-dissipation plate 1, the head substrate 10, and the printed circuit board 20 expand as a result of being heated, their thermal strains are absorbed by the stretching and contraction of the second thick portion 2b of the resilient adhesive 2, so that their original shapes are effectively maintained.

Next, the electrode pads 16, the separate electrode 15b, and the drive elements 21 connected by the Au joining wire 30 are covered with the sealing resin 31, such as epoxy resin or silicon resin. Then, the sealing resin 31 is hardened by, for example, heating. In this embodiment, since the sealing is performed after previously adhering the head substrate 10 and the printed circuit board 20 to the aluminum heat-dissipation plate 1, the resilient adhesive 2 prevents the head substrate 10 and the printed circuit board 20 from easily bending. Therefore, even if the sealing resin 31 which has expanded as a result of being heated is hardened, warping of the head substrate 10 and the printed circuit board 20 is mitigated. A surrounding area of the electrode pads 16 and a surrounding area of the drive elements 21 are in a temperature environment of approximately 120° C. or higher as a result of the heating carried out to harden the sealing resin 31 in the sealing step. Excess heat that has been applied is primarily transmitted to the aluminum heat-dissipation plate 1 via the second thin portion 2d of the resilient adhesive 2, and emitted outward from the aluminum heat-dissipation plate 1. The thermal strains of the aluminum heat-dissipation plate 1, the head substrate 10, and the printed circuit board 20 are absorbed by the stretching and contraction of the second thick portion 2b of the resilient adhesive 2.

By the above-described steps, the thermal head H1 shown in FIG. 1 is completed. When the thermal head H1 is operating, the heating resistors 13 repeatedly generate and dissipate heat in a very short period, and excess heat from the heating resistors 13 is emitted outward via the first thin portion 2c and the first thick portion 2a of the resilient adhesive 2 and the aluminum heat-dissipation plate 1. Although, here again, the aluminum heat-dissipation plate 1 tends to expand as a result of being heated, the thermal strains are absorbed by the resiliency of the first thick portion 2a of the resilient adhesive 2.

Figure 6:
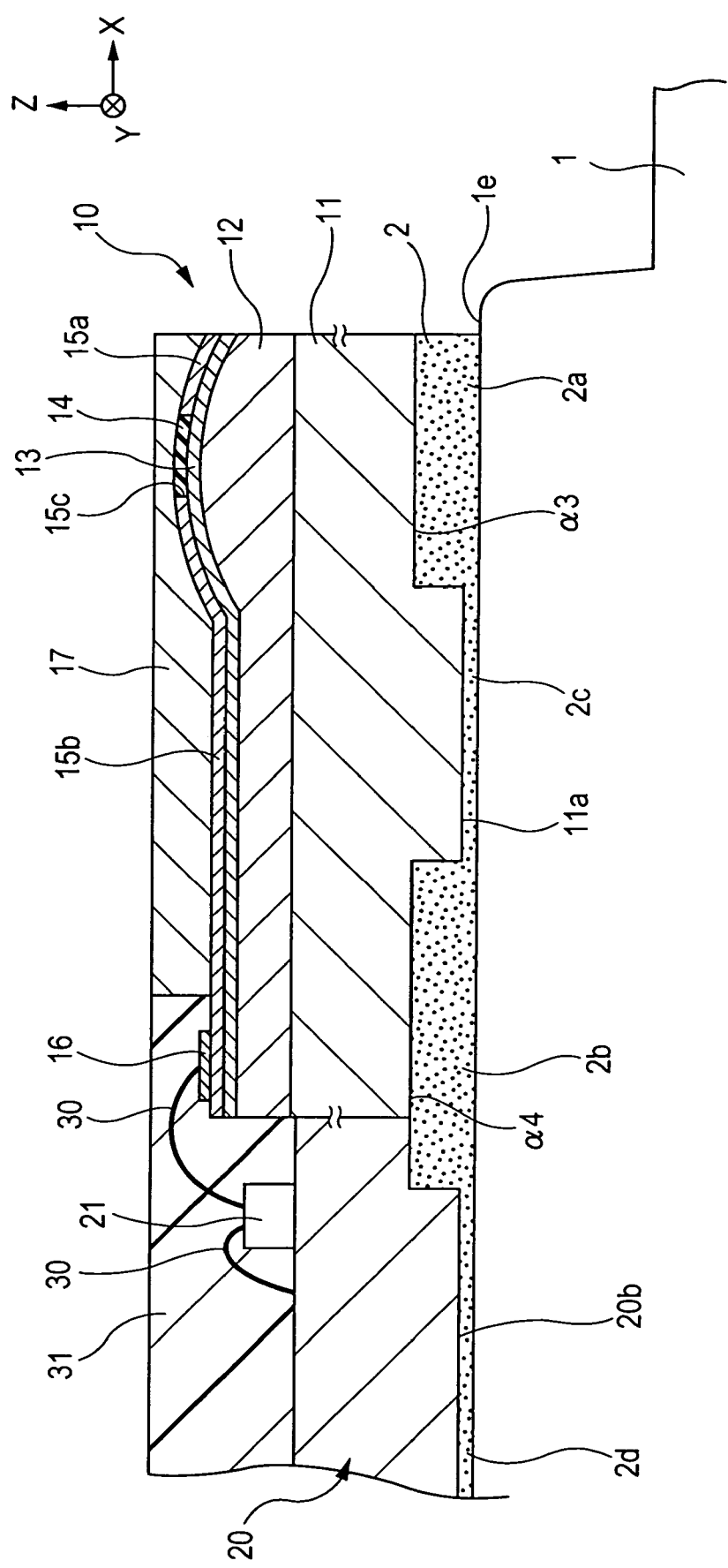
FIG. 6 is a sectional view of the structure of another thermal head.
Figure 7:
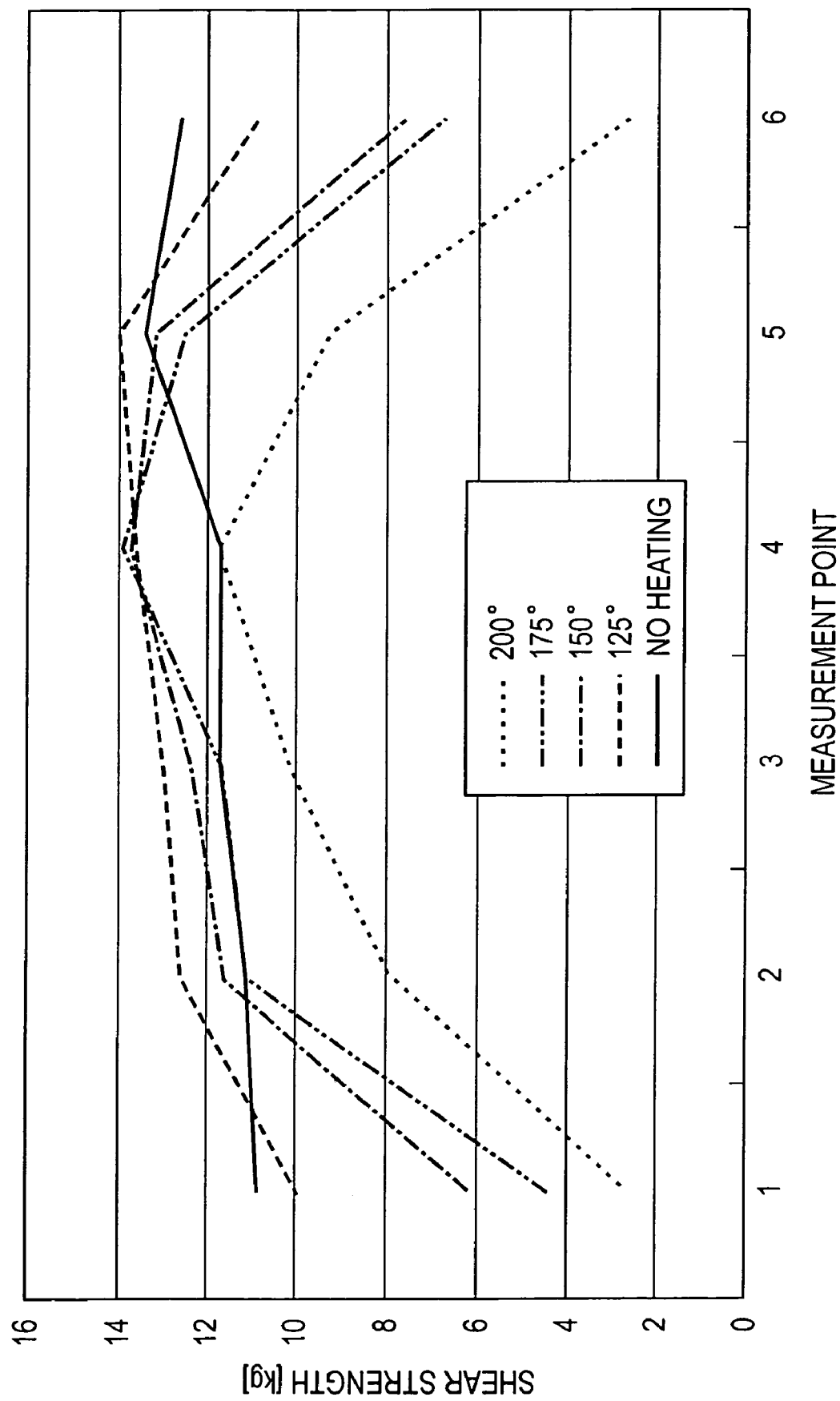
FIG. 7 is a graph illustrating the dependence upon position and temperature of the shear strength after heating of an adhesive having a uniform thickness.

In this example, the lower surfaces of the printed circuit board 20 and the head substrate 10 are flat surfaces, and the upper surface of the aluminum heat-dissipation plate 1 is a non-planar surface having the wide-gap stepped portions α1 and α2, the lower surfaces may be non-planar surfaces and the upper surface may be a flat surface. More specifically, as shown in FIG. 6, the surface of an aluminum heat-dissipation plate 1 may be a flat surface 1e, and wide-gap stepped portions α3 and α4, which increase an interval d between an adhesion surface of a head substrate 10 and an adhesion surface of the aluminum heat-dissipation plate 1 and between an adhesion surface of a printed circuit board 20 and the adhesion surface of the aluminum heat-dissipation plate 1, may be formed in a lower surface 11a of the head substrate 10 and a lower surface 20b of the printed circuit board 20, respectively. In this embodiment, a resilient adhesive 2 is applied to the lower surfaces of the head substrate 10 and the printed circuit board 20 having the respective wide-gap stepped portions α3 and α4, and the aluminum heat-dissipation plate 1 is placed thereon. By hardening the resilient adhesive 2, the aluminum heat-dissipation plate 1 is adhered to the printed circuit board 20 the head substrate 10. During the adhering step, the positions of the aluminum heat-dissipation plate 1, the head substrate 10, and the printed circuit board 20 do not have to be as strictly determined as in the other example, which may facilitate production.

In each example, the head substrate 10 used is a rear edge type, the present invention is applicable to a thermal head using either a partially glazed or a completely glazed head substrate, or to a thermal head using a silicon head substrate.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

What is claimed is:
1. A thermal head, comprising:
a head substrate having a resistor, a longitudinal axis and a width normal to the longitudinal axis;
a heat-dissipation plate having a longitudinal axis and a width normal to the longitudinal axis;
an adhesive layer formed between the head substrate and the heat dissipation plate, the adhesive layer having a first thickness portion and a second thickness portion, the first thickness portion being thicker than the second thickness portion;
a first recess portion formed in the head substrate or the heat-dissipation plate and extending substantially across the width thereof;
a second recess portion formed in the head substrate or the heat-dissipation plate and extending substantially across the width thereof the second recess portion separated from the first recess portion along the longitudinal axes; and
the first and second recess portions corresponding to the first thickness portion of the adhesive layer and an area between the first and second recess portions corresponding to the second thickness portion of the adhesive layer.
2. The head as in claim 1, wherein the adhesive is resilient.
3. The head as in claim 1, wherein the heating resistor comprises a plurality of resistors disposed linearly.
4. The head as in claim 3, wherein the linearly disposed heating resistors are located near a first end of the head substrate.
5. The head as in claim 1, wherein the first thickness portion of the adhesive layer is approximately 50 μm.
6. The head as in claim 1, wherein an individual electrode and a common electrode connect to the resistor.
7. The head as in claim 6, wherein a first end of the individual electrode is disposed at an end of the head substrate distal from the resistor.
8. The head as in claim 7, wherein a second recess portion in one of the head substrate and the heat-dissipation plate is disposed opposite the first end of the individual electrode.
9. The head as in claim 8, wherein a thickness of a third portion of adhesive layer disposed between the second recess portion and the first end of the individual electrode is approximately 50 μm.
10. The head as in claim 9, wherein a thickness of a first portion of the adhesive layer and the thickness of the third portion of the adhesive layer are substantially equal.
11. The head as in claim 8, wherein the areas of the portions of the first and the second recess portions underlying the head substrate are substantially equal.
12. The head as in claim 1, wherein the heat-dissipation plate is aluminum.
13. A thermal head comprising:
a head substrate, the substrate having a resistor;
a heat-dissipation plate;
an adhesive layer disposed between the head substrate and the heat dissipation plate, wherein a first recess portion in one of the head substrate and the heat-dissipation plate is disposed opposite the resistor;
an individual electrode and a common electrode connected to the resistor, wherein a first end of the individual electrode is disposed at an end of the head substrate distal from the resistor;
a second recess portion in one of the head substrate and the heat-dissipation plate disposed opposite the first end of the individual electrode; and a first length of the second recess portion in a direction parallel to the individual electrode is greater than a first length of the first recess portion in a direction parallel to the individual electrode.

14. The head as in claim 13, wherein a second length in a direction parallel to the individual electrode of the portion of the second recess portion disposed under the head substrate is substantially equal to the first length of the first recess portion.

15. The head as in claim 14, where the first length of the second recess portion is greater than the second length of the second recess portion.

16. A method for producing a thermal head assembly, the method comprising:
   providing a head substrate, the head substrate having a resistor, a common electrode and an individual electrode, the individual electrode having a first end disposed at an opposite end of the head substrate from the resistor;
   providing a heat-dissipating plate, one of the heat-dissipating plate and the substrate having a first and a second recess portion formed therein, the first recess portion being positioned opposite the resistor, the second recess portion separated from the first recess portion along a longitudinal axis of the heat-dissipating plate;
   providing a printed circuit board;
   forming a resilient adhesive layer between the head substrate and the heat-dissipating plate and between the printed wiring assembly and the heat-dissipating plate, said adhesive layer extending substantially across a width of the substrate or the heat-dissipation plate.

17. The method of claim 16, wherein the resistor comprises a plurality of linearly disposed resistors.

18. The method of claim 16, wherein one of the heat-dissipating plate and the substrate has a second recess portion formed therein, the second recess portion being positioned opposite the first end of the individual electrode.

19. The method of claim 18, further comprising:
   wire bonding the individual electrode at the head substrate and a drive element at the printed circuit board; and
   forming a sealing layer over the bonded individual electrode at the head substrate and the bonded drive element at the printed circuit board.

20. The method of claim 19, wherein the individual electrode is formed of aluminum and the wire bonding is performed on the individual electrode and the drive element at the printed circuit board with a gold joining wire.

* * * * *

UNITED STATES PATENT AND TRADEMARK OFFICE
CERTIFICATE OF CORRECTION

| | |
|---|---|
| PATENT NO. | : 7,250,960 B2 |
| APPLICATION NO. | : 11/092181 |
| DATED | : July 31, 2007 |
| INVENTOR(S) | : Tsutomu Takeya et al. |

It is certified that error appears in the above-identified patent and that said Letters Patent is hereby corrected as shown below:

<u>In the Claims</u>

Column 10, in claim 1, line 16, immediately after "the width thereof" insert --,-- (comma).

Column 10, in claim 1, line 20, immediately after "of the adhesive layer" insert --,-- (comma).

Signed and Sealed this

Fourth Day of December, 2007

JON W. DUDAS
*Director of the United States Patent and Trademark Office*